United States Patent [19]
Mitani

[11] Patent Number: 6,078,526
[45] Date of Patent: Jun. 20, 2000

[54] FLASH MEMORY WITH PLURAL MEMORY CHIPS OF SAME MEMORY CAPACITY AND SYSTEM UTILIZING THE SAME

[75] Inventor: Hidenori Mitani, Tokyo, Japan

[73] Assignee: Mitsubishi Denki Kabushiki Kaisha, Tokyo, Japan

[21] Appl. No.: 09/207,034

[22] Filed: Dec. 8, 1998

[30] Foreign Application Priority Data

Jun. 16, 1998 [JP] Japan .................................. 10-168276

[51] Int. Cl.$^7$ .................................................. G11C 16/04
[52] U.S. Cl. ................................ 365/185.33; 365/230.03
[58] Field of Search ........................ 365/185.33, 230.03, 365/230.06

[56] References Cited

U.S. PATENT DOCUMENTS 5,338,981  8/1994  Kim et al. ............................... 307/463
5,406,520  4/1995  Tay ......................................... 365/200

FOREIGN PATENT DOCUMENTS 5-210577  8/1993  Japan .

*Primary Examiner*—Vu A. Le
*Attorney, Agent, or Firm*—McDermott, Will & Emery

[57] ABSTRACT

A flash memory comprises a plurality of flash memory chips of the same memory capacity. Serial extension addresses are assigned to the plurality of flash memory chips and the plurality of flash memory chips have serial address spaces corresponding one to one to the extension addresses. One of the plurality of flash memory chips is enabled in accordance with an extension address included in address information input from outside.

6 Claims, 5 Drawing Sheets bit 0, 1 : Chip select
bit 2~7 : invalid

| bit0 | bit1 | |
|---|---|---|
| 0 | 0 | Chip 220 |
| 1 | 0 | Chip 221 |
| 0 | 1 | Chip 222 |
| 1 | 1 | Chip 223 |

FLASH MEMORY WITH PLURAL MEMORY CHIPS OF SAME MEMORY CAPACITY AND SYSTEM UTILIZING THE SAME

BACKGROUND OF THE INVENTION

1. Field of the Invention

The present invention relates to a flash memory and a system utilizing the same, and more particularly to an expansion of a capacity of the flash memory.

2. Description of the Related Art

There have been two ways executed to expand a memory capacity utilizable by a system loading a flash memory chip (referred to simply as a "chip" hereinafter) as an information recording medium.

A first method is to replace the chip with one having a larger capacity. For instance, supposing that a memory capacity of 64 Mbit allowed for the system is to be extended to 128 Mbit, the chip of 64 Mbit capacity already loaded in the system is removed and a fresh chip of 128 Mbit capacity is installed in place of the 64 Mbit chip. In this manner, a continuously accessible address space for a control part of the system is extended from 0-3FFFh to 0-7FFFh without switching a chip enable signal.

The replacement method is effective when a count of chips to be added to the system is limited. However, the already loaded chip of 64 Mbit capacity is wasted in the above example, thereby lowering the cost efficiency of the system because the chip of 64 Mbit or larger capacity is expensive.

Another method is to add chips. In the same case as above, namely, where the memory capacity of the system is to be extended from 64 Mbit to 128 Mbit, a fresh chip of 64 Mbit memory capacity is added to the system wherein one chip of 64 Mbit capacity is already fitted. The method is effective if there is spare room to increase a count of chips in the system.

FIG. 10 is a diagram showing a state where a 64 Mbit chip 502 is added to a system already equipped with a 64 Mbit chip 501.

Each chip 501, 502 has an address space of 0h-3FFFh. A control part 500 carries out a sequence at the write time or read time for data which consists of outputting an "L" chip enable signal CE1# or CE2# thereby switching the chip 501 or 502 to be accessible, outputting a write or read command via a common signal line, outputting an address signal designating a sector address to be accessed, and outputting write data or receiving read data. A symbol # in the chip enable signal represents that the signal level is inverted, i.e., the chips 501, 502 are low active.

The above-described addition method extends the memory capacity utilizable in the control part 500 of the system to 128 Mbit without wasting the already-loaded 64 Mbit chip.

However, the continuously accessible address space remains as it is, that is, 0-3FFFh according to the addition method unless the control part 500 switches the chip enable signal. In contrast, the continuously accessible address space is extended to 0-7FFFh without switching of the chip enable signal by the control part according to the replacement method.

Depending on a size of data to be accessed, therefore, the chip enable signal is required to be switched repeatedly to write or read data alternately to the two chips 501 and 502. In other words, as compared with the replacement method, an access speed is decreased according to the addition method due to a time necessary for switching of the chip enable signal.

Besides, a count of chip enable signals is increased by a count of chips added. Since the control part 500 can control a limited count of chip enable signals which is generally small, an extension of the memory capacity sometimes fails of sufficiency in the addition method.

In the meantime, a semiconductor device disclosed in the published specification of Tokkaihei 5-210577 published in Aug. 20, 1993 incorporates a chip selection circuit, wherein an external terminal is provided exclusively for inputting of a chip select signal in addition to a chip enable terminal, so that a chip specified by values of a signal input via the external terminal and the chip enable signal is switched into an accessible state.

A count of extensible chips can be increased without increasing the count of chip enable signals required for the control in the above-described constitution of the semiconductor device. However, the control part 500 needs not only the chip enable signal, but the chip select signal to specify the chip to be accessed.

Moreover, in writing or reading data, the control part 500 is necessitated to carry out a process of generating and outputting the chip select signal in addition to the normal sequence which, as described earlier, consists of outputting the command, outputting the address signal, and outputting write data or receiving read data. As a result, an access speed at the read time and write time is decreased.

SUMMARY OF THE INVENTION

The present invention has for its object to provide a flash memory extending a utilizable system memory capacity without increasing a count of chip enable signals required for the purpose of control and without lowering an access speed.

A further object of the present invention is to provide a system loading the above flash memory.

In order to achieve the aforementioned objective, a flash memory is provided in one aspect of the present invention which writes or reads data to a sector address designated by an address signal input from outside. The flash memory comprises a plurality of flash memory chips each having the same memory capacity wherein continuous extension addresses are assigned sequentially from 0h and continuous address spaces are assigned sequentially from 0h in accordance with values of the extension addresses, and a chip select circuit which switches the flash memory chip to an accessible state if it has bit data upper than an uppermost bit of bits indicative of a sector address of the flash memory chip among the address signal input from outside, of the same value as the assigned extension address.

The flash memory can switch the chip to which the sector address designated by the address signal into the accessible state on the basis of a value of the input address signal, without a signal prepared separately for switching of the chip.

A flash memory provided according to another aspect of the present invention comprises a plurality of flash memory chips wherein continuous extension addresses are assigned sequentially from 0h, and continuous address spaces are assigned sequentially from 0h in accordance with values of the extension addresses, wherein the flash memory chip is switched to an accessible state if it has bit data than an uppermost bit of bits indicative of a sector address of the flash memory chip of the same value as the assigned extension address.

This flash memory alike exerts the same effect as the earlier-described flash memory.

A system loading a flash memory provided according to the present invention comprises a plurality of the flash memories(memory chips?) in the above constitution, and a control part which writes or reads data to a sector address designated by an address signal in address spaces of the flash memory chips. A chip select circuit may or may not be incorporated in the flash memory.

In any case, a suitable flash memory chip can be accessed to simply through outputting of the address signal designating the sector address assigned thereto. In other words, while the flash memory contains the plurality of flash memory chips, the control part can handle the chips as a single chip, thereby eliminating a special external signal for the purpose of selecting the chip, thus achieving quick processing of data.

BRIEF DESCRIPTION OF THE DRAWINGS

The present invention will become readily understood from the following description of preferred embodiments thereof made with reference to the accompanying drawings throughout which like parts are designated by like reference numerals, and in which.

DETAILED DESCRIPTION OF THE EMBODIMENTS

A flash memory according to the present invention has four flash memory chips (referred to as a "chip" hereinbelow) accommodated in one package. Continuous extension addresses (e.g., 00, 01, 10, 11) and address spaces continuous in the order of the extension addresses (e.g., 0-3FFFh, 4000-7FFFh, 8000-BFFFh, C000-FFFFh) are allotted to the four chips of the same memory capacity, i.e., 64 Mbit. The flash memory has a function to switch into an accessible state the chip which includes bit data (upper two bits) more significant than an uppermost bit among bits related to the designation for a sector address of the chip to which 0h address is allotted, that is, the chip to which 0h-3FFFh address space is allotted, among address signals input from outside, of a value agreeing with a value of the allotted extension addresses.

A control part of a system can accordingly extend the continuously utilizable address space of the flash memory including one chip by four times, specifically, from 0-3FFFh to 0-FFFFh without switching a chip enable signal.

Embodiment 1

A flash memory 100 according to an embodiment 1 will be described hereinbelow.

Figure 1:
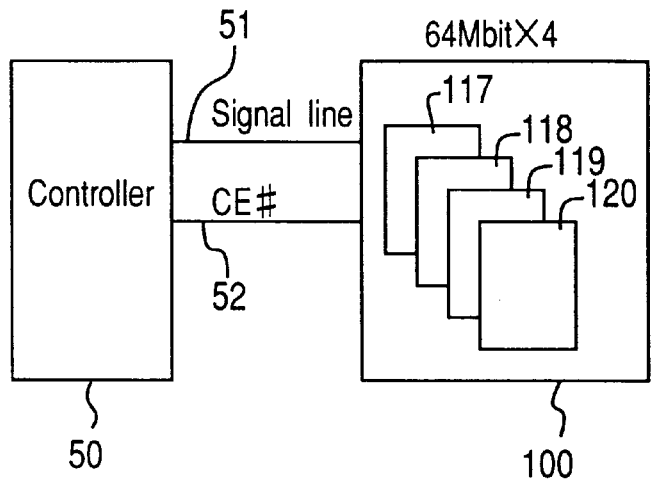
FIG. 1 is a diagram showing the constitution of a system using a flash memory according to a first embodiment of the present invention.

FIG. 1 shows the constitution of a system loading the flash memory 100. The flash memory 100 incorporates four chips 117–120 of 64 Mbit memory capacity each in one package. Extension addresses (00, 01, 10, 11) and address spaces (0-3FFFh, 4000-7FFFh, 8000-BFFFh, C000-FFFFh) continuous in the order of the extension addresses are allotted to the corresponding chips 117–120.

A control part 50 of the system is connected to the flash memory 100 via signal lines 51 and 52. The control part 50 carries out a sequence of outputting an "L" chip enable signal CE# via the signal line 52 thereby switching the flash memory 100 to an accessible state, outputting a write or read command for data via the signal line 51, outputting a 2-byte (16-bit) address signal designating a sector address to be accessed, and outputting write data or receiving read data. The symbol # in the above enable chip signal represents the signal level is inverted, that is, the chips 117–120 are low active.

As will be discussed later, the flash memory 100 does not need any special signal for switching of the chips and switches the chip to which the sector address designated by the address signal input from the system is allotted into the accessible state in accordance with a value of the address signal.

Figure 2:
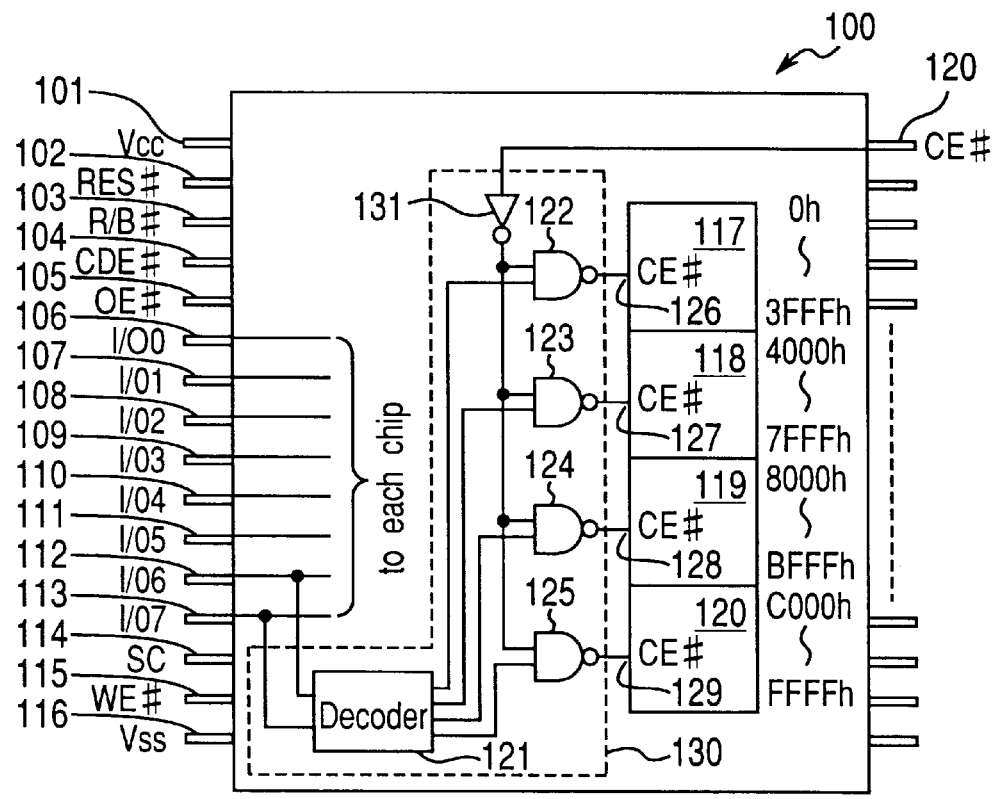
FIG. 2 is a diagram showing the constitution of the flash memory of FIG. 1.

FIG. 2 is a diagram of the constitution of the flash memory 100. Four chips 117–120 of 64 Mbit memory capacity are contained in the flash memory 100. To the chip 117 are allotted the extension address "00" and addresses 0h-3FFFh. To the chip 118 are allotted the extension address "01" and addresses 4000h-7FFFh. The chip 119 has the extension address "10" and addresses 8000h-BFFFh, and the chip 120 has the extension address "11" and addresses C000h-FFFFh.

An operating voltage Vcc, a reset signal RES# and the like predetermined signals are input to the four chips 117–120 via pins 101–105, 114–116 provided at the package side of the flash memory 100. Moreover, the data write or read command, 2-byte (16-bit) address signal consisting of 1-byte signals SA1, SA2, and write data or read data are delivered via pins 106–113 having terminals I/O0–I/O7.

The address signal output from the control part 50 is 16-bit data composed of 1-byte signals SA1, SA2 in a range of values 0-FFFFh. Table 1 below shows correspondences of the signals SA1, SA2 input in parallel per byte from the terminals I/O0–I/O7 and 16-bit data A0–A15 for use in designation of the address, in which bitn (n is an integer of 0–7) indicates a position of each bit in the 1-byte data.

TABLE 1

| bit position | bit 0 | bit 1 | bit 2 | bit 3 | bit 4 | bit 5 | bit 6 | bit 7 |
|---|---|---|---|---|---|---|---|---|
| address | | | | | | | | |
| SA(1) | A0 | A1 | A2 | A3 | A4 | A5 | A6 | A7 |
| SA(2) | A8 | A9 | A10 | A11 | A12 | A13 | A14 | A15 |

In accessing to the address space 0-3FFFh, data A14, A15 of upper 2 bits of the address signal (bit data of bit6, bit7 of the signal SA2) are "0", "0". In accessing to the address space 4000-7FFFh, the bit data A14, A15 of the address signal are "1", "0". In accessing to the address space 8000-BFFFh, the bit data A14, A15 of the address signal are "0", "1". For the address space C000-FFFFh, the bit data A14, A15 of the address signal are "1", "1".

The flash memory 100 is equipped with a chip select circuit 130 surrounded by a dotted line in FIG. 2 which handles values of the bit data A14, A15 arranged in the order from A15 to A14 of the address signal (bit data of bit6, bit7 of the signal SA2) input from the control part 50 as an extension address, thereby selecting, as an object to be accessed, the chip to which the extension address is allotted.

The chip select circuit 130 is constituted of a decoder 121 and NAND gates 122–125. The decoder 121 is effective only in a sequence where the signal SA2 is input.

The decoder 121 has two input terminals and four output terminals. Pins 112, 113 with I/O6, I/O7 are connected to the two input terminals. The four output terminals are connected to one input terminals of the two-input NAND gates 122–125. A chip enable terminal 120 is connected to the other input terminals of the NAND gates 122–125 via an inverter 131. Output terminals of the NAND gates 122–125 are connected to chip enable terminals 126–129 of the corresponding chips 117–120.

In the case where the bit data A14, A15 of the address signal input via the pins 112 and 113 (bit data of bit6, bit7 of the signal SA2) are "0", "0", the decoder 121 outputs an "H" control signal to the NAND gate 122. When the chip enable signal CE# input via the terminal 120 is "L", the NAND gate 122 outputs in response to the input of the "H" control signal, an "L" signal to the chip enable terminal 126 of the chip 117, so that the chip 117 to which the extension address "00" and address space "0-3FFFh" are assigned is brought into the accessible state.

If the bit data A14, A15 of the address signal input through the pins 112 and 113 (bit data of bit6, bit7 of the signal SA2) are "1", "0", the decoder 121 outputs the "H" control signal to the NAND gate 123. When the chip enable signal CE# input through the terminal 120 is "L", the NAND gate 123 outputs the "L" signal to the chip enable terminal 127 of the chip 118 in accordance with the input of the "H" control signal, thereby switching the chip 118 to which the extension address "01" and address space 4000-7FFFh are assigned to the accessible state.

If the bit data A14, A15 of the address signal input through the pins 112 and 113 (bit data of bit6, bit7 of the signal SA2) are "0", "1", the decoder 121 outputs the "H" control signal to the NAND gate 124. At this time, if the chip enable signal CE# input through the terminal 120 is "L", the NAND gate 124 outputs the "L" signal to the chip enable terminal 128 of the chip 119 in accordance with the input of the "H" control signal, with switching the chip 119 where the extension address "10" and address space 8000-BFFFh are allotted into the accessible state.

In the case where the bit data A14, A15 of the address signal input through the pins 112 and 113 (bit data of bit6, bit7 of the signal SA2) are "1", "1", the decoder 121 outputs the "H" control signal to the NAND gate 125. If the chip enable signal CE# input via the terminal 120 is "L", the NAND gate 125 outputs the "L" signal to the chip enable terminal 129 of the chip 120 in compliance with the input of the "H" control signal, thereby switching the chip 120 where the extension address "11" and address space C000-FFFFh are allotted to the accessible state.

As described hereinabove, the flash memory 100 switches the chip to which the sector address designated by the address signal input from the system is assigned into the accessible state on the basis of a value of the input address signal, without requiring a special signal for the switching of the chip.

Therefore, the control part 50 of the system using the flash memory 100 handles the flash memory 100 comprising four chips 117–120 of 64 Mbit capacity totally in the same manner as a flash memory consisting of one chip of 256 Mbit capacity having a continuous address space 0-FFFFh. With the elimination of a sequence of switching to the required chip, the control part 50 can process data quickly at the write and read time.

The flash memory 100 in the above example has four chips of 64 Mbit capacity contained in one package. However, eight chips of 32 Mbit memory capacity each may be accommodated in one package, or the like arrangement is adoptable.

In such case, 3-bit extension addresses (000, 001, 010, 011, . . . ) and address spaces continuous in the order of the extension addresses (0-1FFFh, 2000h-3FFFh, 4000-5FFFh, 6000-7FFFh, . . . ) are assigned to the chips and, a chip select circuit is provided which handles bit data A12, A13, A14 of the address signal 0-FFFFh input from the system as an extension address arranged in the order from A14 to A13 to A12 and enables the chip having the subject extension ad-dress.

Embodiment 2

Figure 3:
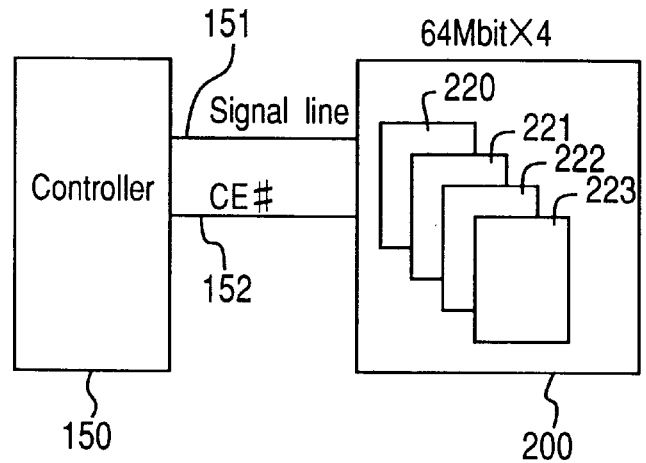
FIG. 3 is a diagram showing the constitution of a system using a flash memory according to a second embodiment of the present invention.

Referring to FIG. 3, a flash memory 200 has four chips 220–223 of 64 Mbit memory capacity to which extension addresses (00, 01, 10, 11) and address spaces (0-3FFFh, 4000-7FFFh, 8000-BFFFh, C000-FFFh) in the order of the extension addresses are assigned. The four chips are contained in one package. A control part 150 of the system and the flash memory 200 are connected with each other via signal lines 151 and 152.

The control part 150 carries out a sequence of procedures, that is, outputs an "L" chip enable signal CE# via the signal line 152 thereby bringing the flash memory 200 into an accessible state, outputs a data write or read command via the signal line 151, outputs a 2-byte (16-bit) address signal designating a sector address to be accessed among the address spaces 0-FFFFh, and outputs write data or receives read data. The symbol # of the chip enable signal indicates the signal level is inverted, and therefore the chips 220–223 are low active.

As will be described later, the flash memory 200 switches the chip to which the sector address designated by the address signal input from the system is allotted, into the accessible state on the basis of a value of the address signal, without requiring a signal to be separately prepared for switching of the chip.

Figure 4:
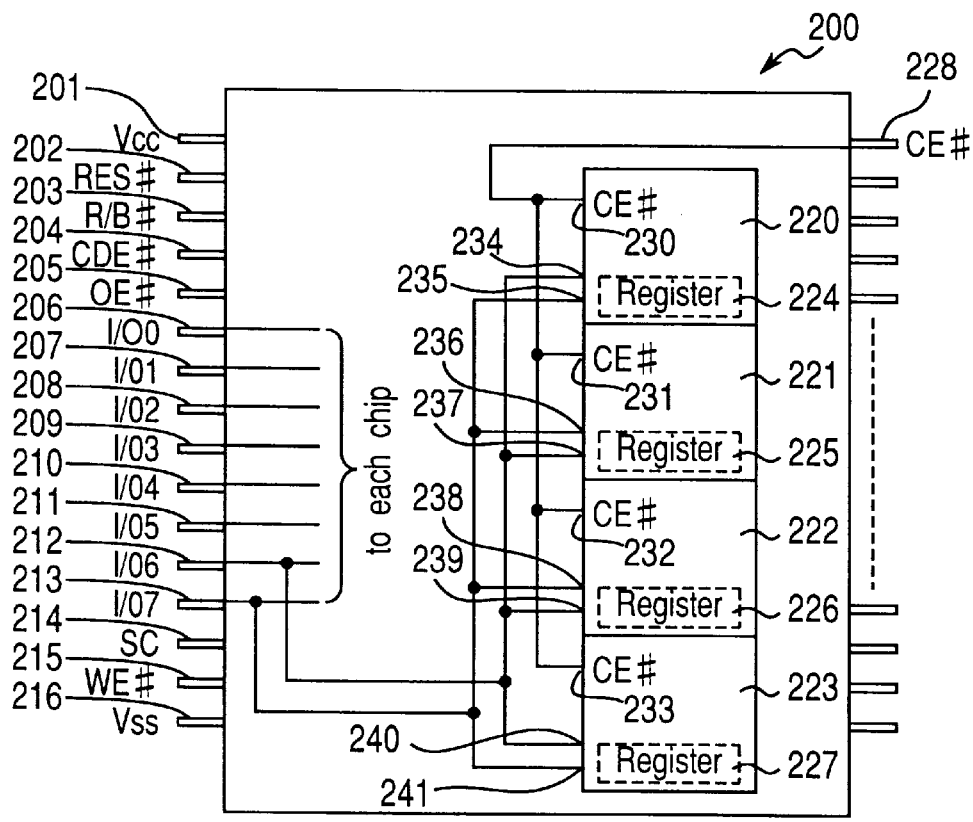
FIG. 4 is a diagram showing the constitution of the flash memory of FIG. 3.

FIG. 4 shows the constitution of the flash memory 200. Four chips 220–223 of 64 Mbit memory capacity are incorporated in the flash memory 200. The chips 220–223 have 1-byte register parts 224–227 for storing the assigned extension addresses, in addition to data storage areas.

Figure 5:
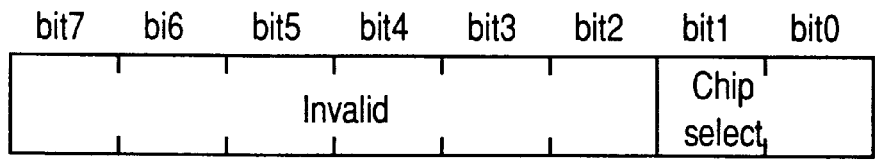
FIG. 5 is a diagram showing the constitution of data in a register part.

As indicated in FIG. 5, each chip 220–223 stores a value of the extension address assigned thereto in 2-bit data composed of bit0 and bit1 in the register part 224–227. Bit data of bit2–bit7 are ignored.

Address spaces (0-3FFFh, 4000-7FEFh, . . . ) are assigned to the chips 220–223 in the order of the extension addresses (00, 01, . . . ) stored in the register parts 224–227. More specifically, the extension address "1001" and address space 0-3FFFh are assigned to the chip 220. The extension address "01" and address space 4000-7FFFh are assigned to the chip 221. The extension address "10" and address space 8000-BFFFh are assigned to the chip 222, and the extension address "11" and address space C000-FFFFh are assigned to the chip 223.

An operating voltage Vcc and predetermined signals such as a reset signal RES#, etc. are input to the four chips 220–221 via pins 201–205, 214–216 set at the package side of the flash memory 200. At the same time, a data write or read command, a 2-byte (16-bit) address signal designating a sector address to be accessed, write data or read data are transmitted via pins 206–213 having I/O0–I/O7 terminals.

The address signal is 16-bit data A0–A15 composed of 1-byte signals SA1, SA2, with assuming a value in a range of 0-FFFFh. The signals SA1, SA2 input in parallel per one byte from the terminals I/O0–I/O7 and 16-bit data A0–A15 used for the designation of the sector address correspond in the same manner as is clearly shown in Table 1.

Pins 212 and 213 allocated to the terminals I/O6 and I/O7 are connected to extension address input terminals 234 and 235, 236 and 237, 238 and 239, 240 and 241 of the chips 220–223 respectively. A chip enable terminal 228 is connected to chip enable terminals 230–233 of the chips 220–223.

An "L" chip enable signal CE# is input to each chip 220–223 via the chip enable terminal 228 of the flash memory 200. At this time, the chip is turned to the accessible state only when a value of the extension address specified by the bit data A14 and A15 of the address signal input through the extension address input terminals 234 and 235, 236 and 237, 238 and 239, 240 and 241 agrees with the extension address assigned to the chip.

The arrangement as above eliminates the decoder 121 used in the flash memory 100 of the embodiment 1, so that the internal constitution is simplified.

Figure 6:
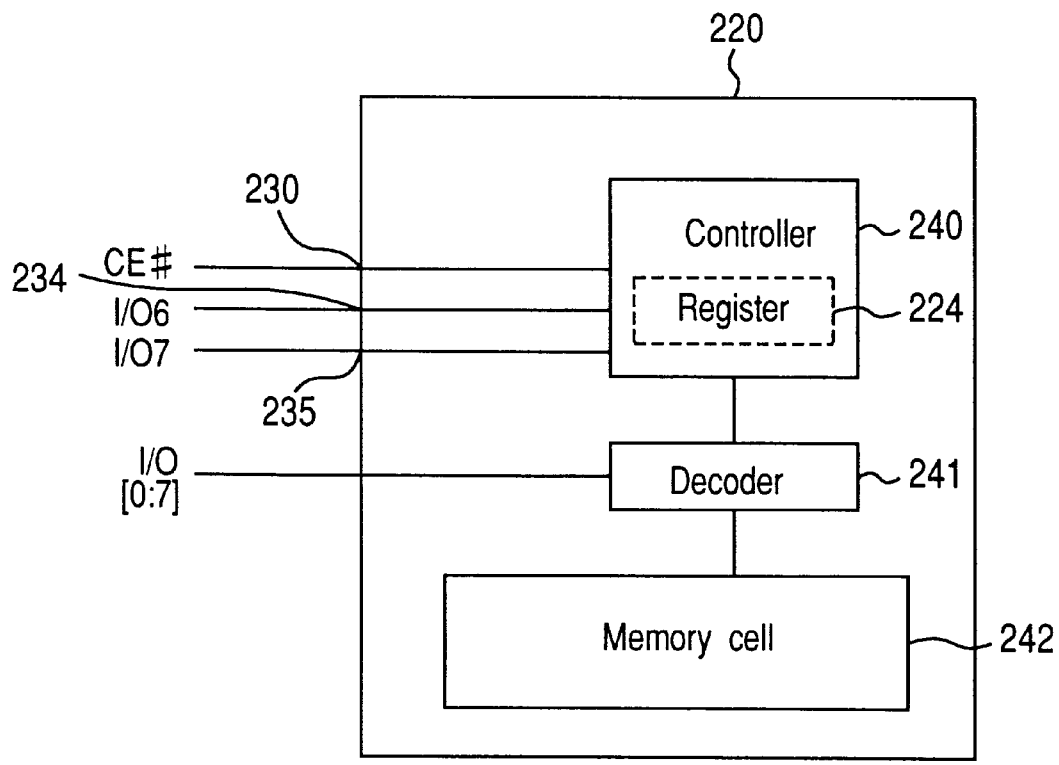
FIG. 6 is a diagram showing the internal constitution of a flash memory chip.

FIG. 6 shows the constitution of the flash memory chip 220. The chip 220 is constituted of a control part 240 enclosing the register part 224, a decoder 241 for outputting a logic sector address specified by the signals SA1, SA2 after changing the address to a physical sector address, and a memory cell 242 as a data storage area.

The register part 224 may be formed at an area not used in the memory cell 242.

A chip enable signal is input to the control part 240 via the chip enable terminal 230, and also bit data A14 and A15 at the terminals I/O6 and I/O7 of the signal SA2 are input via the extension address input terminals 234, 235. A value of the extension address stored in the register part 224 is set by the control part 150 of the system using the flash memory 200 except for the data write or read time. The decoder 241 allots the address space to be specified on the basis of the value of the assigned extension address. Concretely, the address space 0-3FFFh is assigned to the extension address "00". The address spaces 4000-7FFFh, 8000-BFFFh and C000-FFFFh are respectively allotted to the extension addresses "01", "10" and "11".

Figure 7:
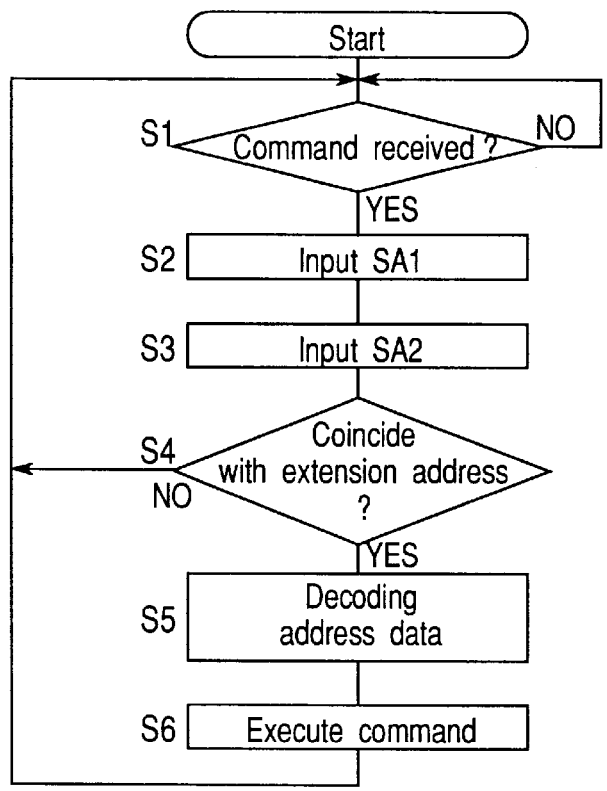
FIG. 7 is a flow chart of a process executed by a control part in the chip at the read or write time of data.

FIG. 7 is a flow chart of a process executed by the control part 240. A command is received first (step S1). If the data write or read command is input (YES in step S1), signals SA1 and SA2 are input (steps S2 and S3). If the command is not input (NO in step S1), the control part waits for a command to be input.

In the event that the value of the extension address (A15, A14) specified by the data bit6, bit7 of the signal SA2, namely, bit data A14 and A15 of the address signal agrees with the value of the extension address stored in the register part 224 (YES in step S4), the decoder 241 is enabled thereby decoding the input address signal (step S5) and executing the designated data write or read command (step S6). In other words, the decoder 241 enabled by the control part 240 specifies a physical sector address corresponding to a logic sector address designated by the address signal input through the pin 206–213 of the terminal I/O0–I/O7, and writes or reads data. The process returns to step S thereafter.

If the value of the extension address (A15, A14) specified by the bit data A14 and A15 of the address signal does not agree with the value of the extension address stored in the register part 224 (NO in step S4), the process goes back to step S1 to receive a command.

As is described hereinabove, the flash memory 200 does not require a special signal for switching of chips, but switches the chip to which the sector address designated by the address signal input from the system is assigned to the accessible state on the basis of the value of the input address signal.

Accordingly, the control part 150 of the system using the flash memory 200 is allowed to handle the flash memory 200 composed of four chips 220–223 of 64 Mbit memory capacity in the same manner as a flash memory of one chip of 256 Mbit capacity having a continuous address space 0-FFFFh. Since a sequence of switching chips is eliminated in the control part 150, quick processing of data is achieved for writing or reading the data.

Although the above flash memory 200 has four chips of 64 Mbit memory capacity stored in one package, eight chips of 32 Mbit memory capacity may be contained in one package.

In such case, a chip select circuit is provided whereby 3-bit extension addresses (000, 001, 010, 011, . . . ) and address spaces (0-1FFFh, 2000-3FFFh, 4000-5FFFh, 6000-7FFFh, . . . ) continuous in the order of the extension addresses are allotted to the register parts of chips, bit data A12, A13, A14 of the address signal (0-FFFFh) input from the system are handled as an extension address arranged in the order of A14, A13 and A12, and the chip to which the target extension address is assigned is switched and enabled.

Embodiment 3

Figure 8:
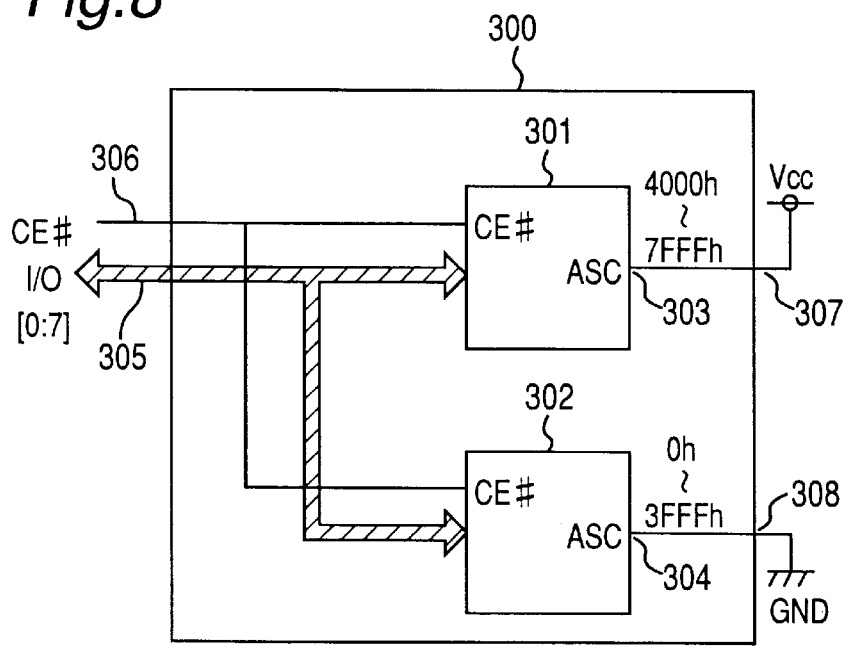
FIG. 8 is a diagram showing the constitution of a flash memory according to a third embodiment of the present invention.

In FIG. 8, two chips 301, 302 each of 64 Mbit memory capacity are incorporated in a flash memory 300. The chips 301, 302 send and receive therebetween a data write or read command, an address signal for designating a sector address to be accessed and write or read data via a group of pins 305 to which terminals I/O0–I/O7 set at the package side of the flash memory 300 are assigned. Similar to the foregoing embodiments 1 and 2, the address signal is 2-byte data (A0–A14) composed of signals SA1, SA2 of 1-byte each.

A chip enable signal CE# is input via a terminal 306 to the chips 301, 302. The symbol # of the chip enable signal shows the inversion of the signal level, and consequently the chips 301, 302 are low active.

Continuous address spaces (0-3FFFh, 4000-7FFFh) are assigned to the chips 301, 302 of the flash memory 300 sequentially in the order of values 0, 1 of the logic level of signals input to ASC terminals 303, 304. When a signal of the grounding level, namely, "0" logic level is input to the ASC terminal 304 of the chip 302 via an external terminal 308, the address space 0-3FFFh is assigned to the chip 302. The chip 302 is turned to a state accessible from the outside when the "L" chip enable signal CE# is input thereto, and moreover if a value of the bit data A14 of the address signal (bit6 of the signal SA2) input via the pin group 305 is equal to the logic level of the signal input to the ASC terminal 308, i.e., if the bit data A14 of the address signal is "10".

A signal of a Vcc level, namely, "1" logic level is input to the ASC terminal 303 of the chip 301 via an external terminal 307. In this case, the address space 4000-7FFFh is assigned to the chip 301.

The chip 301 is brought into a state accessible from outside when the "L" chip enable signal CE# is input and at the same time, a value of the bit data A14 of the address signal (bit6 of the signal SA2) input via the pin group 305 is equal to the logic level of the signal input to the ASC terminal 307, that is, the bit data A14 of the address signal is "1".

Figure 9:
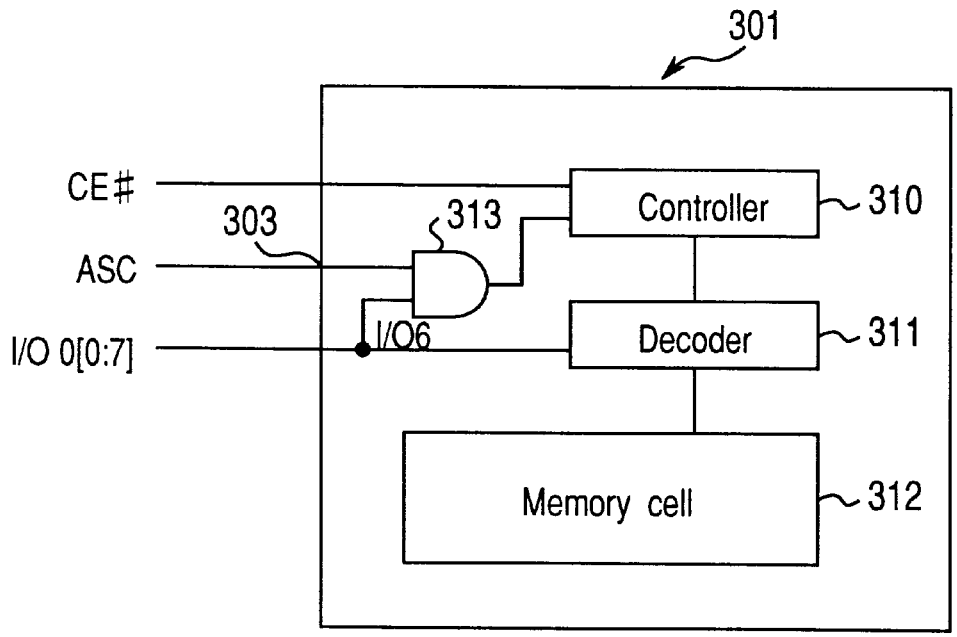
FIG. 9 is a diagram of the internal constitution of a flash memory chip.
Figure 10:
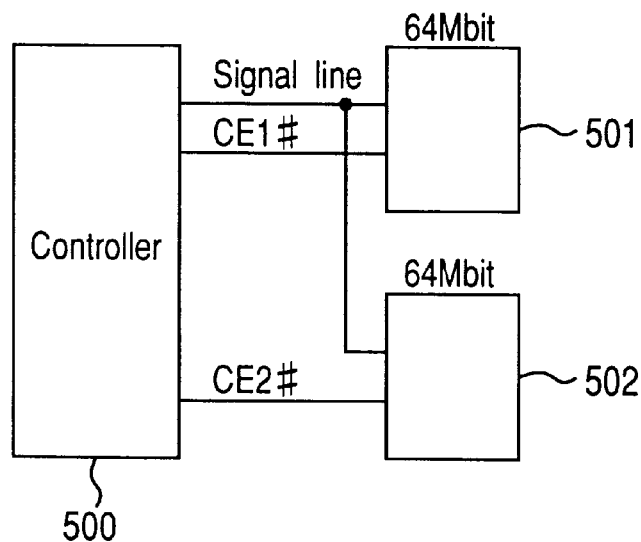
FIG. 10 is a diagram of the constitution of a system using a flash memory in the prior art.

FIG. 9 indicates the internal constitution of the chip 301. The chip 301 is constituted of a control part 310, a decoder part 311, a memory cell 312 and an AND gate 313.

To the control part 310 are input the chip enable signal CE# via the chip enable terminal 306 of the flash memory 300, and an output from the two-input AND gate 313. One input terminal of the AND gate 313 is connected to the ASC terminal 303. Bit data A14 of the address signal (bit6 of the signal SA2) is input to the other input terminal of the AND gate 313. In other words, the AND gate 313 outputs an "H" signal when the logic level of the signal input to the ASC terminal 303 agrees with the value of the bit data A14 of the address signal. The control part 310 outputs a control signal switching to enable decoder 311 when receiving both the "L" chip enable signal CE# and the "H" signal from the AND gate 313.

The address signal (A0–A15) is input to the decoder part 311. The decoder 311 enabled by the control part 310 decodes the address signal, thereby writing or reading data to a physical address of the memory cell 312 designated by the address signal.

The address spaces assigned to chips may be fixed by an aluminum wiring connecting the ASC terminals 303 and 304 to a Vcc input pin and to a grounding pin provided at the lateral part of the flash memory 300 respectively. Or a fuse that can be trimmed by a laser may be fitted to the chips 301, 302, so that the address space to be assigned is changed by cutting or non-cutting of the fuse. Alternatively, a transistor is provided to the chips 301, 302, thereby setting the address space to be assigned by means of writing of data to the transistor. According to any of the above-described arrangement, the external terminals 307 and 308 are eliminated.

As discussed hereinabove, the flash memory 300 switches the chip to which the sector address designated by the address signal input from the system is assigned into the accessible state without a special signal for the purpose.

Therefore, a control part (not shown) of the system using the flash memory 300 can handle the flash memory 300 consisting of two chips 301 and 302 of 64 Mbit capacity completely in the same manner as a flash memory of one chip of 128 Mbit capacity having a continuous address space 0-7FFFh.

Moreover, because of no need for a signal for switching of chips, a sequence of switching of the chip to be accessed is eliminated and accordingly data can be processed speedily at the read or write time.

Although two chips of 64 Mbit capacity are used in the above flash memory 300, a count of chips can be increased to four in an arrangement whereby each chip is provided with the ASC terminal through which 2-bit extension address data are input and, continuous address spaces (0-3FFFh, 4000-7FFFh, 8000-BFFFh, C000-FFFFh) are assigned in the order of values of 2-bit logic data (00, 01, 10, 11) input to the terminal.

Although the present invention has been described in connection with the preferred embodiments thereof with reference to the accompanying drawings, it is to be noted that various changes and modifications are apparent to those skilled in the art. Such changes and modifications are to be understood as included within the scope of the present invention as defined by the appended claims unless they depart therefrom.

What is claimed is:

1. A flash memory comprising:
   a plurality of flash memory chips to which extension addresses are serially assigned, each flash memory having an identical memory capacity and an address space different from each other and corresponding one to one to the extension address assigned; and
   a chip select circuit for selecting a flash memory chip among said plurality of flash memory chips to enable the same in accordance with an extension address included in address information input from outside.

2. The flash memory as set forth in claim 1, wherein the address information input from outside includes an extension address and sector address and the extension address is assigned as bit data locating -upper than an upper most bit of bits indicative of the sector address.

3. The flash memory as set forth in claim 1, wherein said chip select circuit comprises a decoder for decoding bit data input from predetermined pins to output an extension address and a gate circuit for applying a chip enable signal to a flash memory chip having an extension address same to the extension address output from said decoder.

4. A flash memory comprising
   a plurality of flash memory chips to which extension addresses are serially assigned, each flash memory having an identical memory capacity and an address space different from each other and corresponding one to one to the extension address assigned; and
   each of said plurality of flash memory chips having a controller for enabling said each flash memory chip if an extension address included in address information input from outside coincides with the extension address assigned thereto.

5. The flash memory as set forth in claim 4, wherein said controller has a register for storing an extension address assigned and enables said each flash memory chip when input bit data indicative of an extension address coincide with bit data stored in said register.

6. A system comprising an information processing apparatus and a flash memory loaded onto said information processing apparatus;
   said flash memory comprising a plurality of flash memory chips to which extension addresses are serially assigned, each flash memory having an identical memory capacity and an address space different from each other and corresponding one-to-one to the extension address assigned
   said information processing apparatus generating address information including an extension address; and
   said flash memory having a chip select circuit for enabling a flash memory chip among said plurality of flash memory chips in accordance with the extension address included in the address information input from said information processing apparatus.

* * * * *

UNITED STATES PATENT AND TRADEMARK OFFICE
CERTIFICATE OF CORRECTION

PATENT NO. : 6,078,526 Page 1 of 1
DATED : June 20, 2000
INVENTOR(S) : Hidenori Mitani It is certified that error appears in the above-identified patent and that said Letters Patent is hereby corrected as shown below:

<u>Column 6,</u>
Line 55, change "4000-7FEFh" to -- 4000-7FFFh --;
Line 58, change "extension address "1001"" to -- extension address "00" --.

Signed and Sealed this

First Day of April, 2003

JAMES E. ROGAN
*Director of the United States Patent and Trademark Office*